US012736593B2

(12) United States Patent
Zhang et al.

(10) Patent No.: US 12,736,593 B2
(45) Date of Patent: Sep. 15, 2026

(54) INSTABILITY FAULT MONITORING METHOD WITH SELF-LEARNING STRONG GENERALIZATION CAPABILITY AND INSTABILITY FAULT MONITORING APPARATUS

(71) Applicant: ZHEJIANG UNIVERSITY, Hangzhou (CN)

(72) Inventors: Xin Zhang, Hangzhou (CN); Xueqi Liu, Hangzhou (CN); Xiaoqi Zhang, Hangzhou (CN); Fanfan Lin, Hangzhou (CN); Hao Ma, Hangzhou (CN); Chuan Yao, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/909,908

(22) Filed: Oct. 8, 2024

(65) Prior Publication Data

US 2025/0377415 A1 Dec. 11, 2025

(30) Foreign Application Priority Data

Jun. 6, 2024 (CN) ......................... 202410728648.4

(51) Int. Cl.
*G01R 31/40* (2020.01)

(52) U.S. Cl.
CPC .................................... *G01R 31/40* (2013.01)

(58) Field of Classification Search
CPC ........ G01R 31/00; G01R 31/40; G01R 31/56; G01R 31/58; G01R 31/66; G06F 2113/04;

(Continued)

(56) References Cited

U.S. PATENT DOCUMENTS

2021/0037044 A1* 2/2021 Achanta ................. G06N 3/047
2022/0036199 A1* 2/2022 Prasanna ................ G06N 3/006

(Continued)

FOREIGN PATENT DOCUMENTS

CN 114169395 A * 3/2022 ......... G06F 18/2155

*Primary Examiner* — Andrew Schechter
*Assistant Examiner* — Matthew W. Baca
(74) *Attorney, Agent, or Firm* — Jiwen Chen; Joywin IP Law PLLC

(57) ABSTRACT

The present invention discloses an instability fault monitoring method with self-learning strong generalization capability and an instability fault monitoring apparatus. First, electrical volume acquisition nodes are identified and data composition features are collected to form samples, the samples including a small number of labeled data samples and a large number of unlabeled data samples. Then, the samples are input into a reinforcement learning network of actor-critic architecture, and self-learning can be realized by means of the network to form different diagnostic models, where actor selects a suitable network layer from action space (alternative models) to construct a deep belief neural network and formulate a corresponding strategy, critic is configured to evaluate the strategy currently formulated by actor, and the reinforcement learning network outputs the corresponding actor-critic architecture and diagnostic model. Finally, the trained diagnostic model is used to diagnose an instability state of a power electronic system online in real time. The method is capable of simultaneously solving the problems about instability monitoring and single-module faults for different power electronic system structures and fault diagnosis tasks, and has strong generalization capability and high adaptive use.

5 Claims, 4 Drawing Sheets

(58) Field of Classification Search
CPC .... G06F 18/213; G06F 18/24; G06F 18/2155; H02K 11/33; H02J 1/00; G06N 3/0464; G06N 3/088; G06N 3/0895; G06N 3/092; G06N 3/09; G06N 3/091; G06N 3/02; G06N 3/08; G06N 3/094; G05B 2219/25255; G05B 2219/33056
See application file for complete search history.

(56) References Cited

U.S. PATENT DOCUMENTS

2022/0343157 A1* 10/2022 Mankowitz ............ G06N 3/008
2023/0062548 A1* 3/2023 Channegowda ..... G01R 31/008

* cited by examiner

INSTABILITY FAULT MONITORING METHOD WITH SELF-LEARNING STRONG GENERALIZATION CAPABILITY AND INSTABILITY FAULT MONITORING APPARATUS

This application claims priority of Chinese Application No. 202410728648.4, filed Jun. 6, 2024, which is hereby incorporated by reference.

FIELD OF TECHNOLOGY

The present invention belongs to the technical field of instability detection for power electronic systems, and particularly relates to an instability fault monitoring method with self-learning strong generalization capability and an instability fault monitoring apparatus.

BACKGROUND TECHNOLOGY

In complex power electronic systems, distributed energy resources (e.g., solar photovoltaic panels and wind turbines), energy storage systems (e.g., batteries), and loads are connected in a network via power electronic converters. This configuration has the advantages of improving energy utilization efficiency, reducing energy losses during transmission, and increasing system reliability. However, when the converters are cascaded with each other, even though each of the converters is stable when working independently, the converters, when combined together, may cause the problem of instability due to impedance mismatch, which in turn affects the normal operation of the power electronic systems.

Conventional instability monitoring for power electronic systems usually relies on impedance measurement-based techniques, which obtain impedance information by introducing small disturbance signals and analyzing response signals. However, this intrusive approach may negatively affect system operation and power quality. Furthermore, in the power electronic systems, not only is there a problem of instability caused by cascading of the converters, but also the independent operation of individual converters may lead to faults, and existing detection methods often fail to account for both situations.

Therefore, to address the following issues: the lack of suitable data-driven methods that may overcome the limitation of small labeled sample data; the lack of methods that may diagnose both the problem of instability caused by impedance mismatch of cascaded converters and independent instability of individual converters; and the lack of generalized state monitoring solutions for different power electronic systems or power electronic systems where the structure changes at any time because of the constant presence of load/source cut-in and cut-out, There is a need to develop a system that may autonomously learn and generate solutions for different tasks.

Patent document CN113536607A discloses a method and system for evaluating a signal transmission system of a substation. The method includes: step S1, establishing a simulation model of the signal transmission system of the substation, and utilizing the simulation model to simulate faulty signal transmission to obtain sample data for fault evaluation; step S2, training, based on the sample data for fault evaluation, a CNN-LSTM time series forecasting model to construct a fault path prediction model for predicting a signal transmission fault path; and step S3, applying the fault path prediction model to the signal transmission system of the substation for online evaluation. The model is unable to automatically optimize parameters and has certain errors.

Patent document CN115828165A discloses a new energy smart microgrid data processing method and system. The method includes: collecting time series data of a digital intelligent energy-saving cabinet; generating features A, B and C of a derivative class based on the preprocessed time series data; inputting the preprocessed data in step S2 into an LSTM to mine temporal features related to faults of the digital intelligent energy-saving cabinet; inputting the features A, B and C of the derivative class generated in step S3 into a convolutional neural network (CNN) to mine spatial features related to the faults of the digital intelligent energy-saving cabinet, and integrating the temporal features and the spatial features; and constructing a fault classification model SVM for the digital intelligent energy-saving cabinet to realize fault classification. However, this method requires large data samples to train the model to achieve accurate fault classification.

SUMMARY OF THE INVENTION

The present invention aims to provide an instability fault monitoring method with self-learning strong generalization capability and an instability fault monitoring apparatus. The method may self-generate suitable diagnostic models for different systems and different instability fault diagnostic tasks for accurate diagnostic localization.

In order to realize the first purpose of the present invention, the following technical solution is provided: an instability fault monitoring method with self-learning strong generalization capability includes the following steps:

step 1, collecting electrical data of each electronic device in a power electronic system, selecting some of the electrical data to be labeled with types of system instability faults, and combining the labeled electrical data with unlabeled electrical data to form dataset samples;

step 2, constructing a classification network based on a deep belief neural network framework, the classification network including a plurality of superimposed and connected network layers and a softmax layer connected to an end network layer, training the classification network using the dataset samples to construct a determination model for determining whether the power electronic system has an instability fault, and optimizing the training process of the classification network using a reinforcement learning algorithm, where a reinforcement learning network takes a network structure composed of different numbers of network layers and a softmax layer as action space, and takes a loss rate of the determination model of previous and latter trainings as an optimization objective to obtain an optimization result, where the optimization result includes a superimposed network structure and a corresponding predicted loss rate; and step 3, inputting the electrical data in the power electronic system into a determination model satisfying a predetermined predicted loss rate in step 2, so as to output a determination result indicating whether the power electronic system has an instability fault.

Specifically, the specific process of collecting the electrical data is as follows:

taking a bus of the power electronic system as a backbone, and regarding power converters in the system as module branches to be connected to the backbone, so as to construct an equivalent model of the power electronic system; and collecting electrical data from each module branch and the backbone according to a predetermined type of instability faults, i.e, determining the corresponding instability fault category K to be identified, the fault problems to be solved being {stability, instability, module 1 failure, module 2 failure, . . . , module K failure}.

Specifically, the reinforcement learning algorithm is an actor-critic reinforcement learning model. Actor and critic are both multilayer perceptron structures, and the diagnostic model to be constructed is a deep belief neural network including a plurality of network layers connected in a superimposed manner as well as a softmax layer connected to an end network layer. The network layers are selected from the action space, and the output classification of the softmax layer connected to the end network layer is determined by a diagnostic task category K targeted.

Specifically, the training process includes an unsupervised pre-training phase and a supervised back-propagation fine-tuning phase;

in the pre-training phase, each of the network layers is trained using a contrastive divergence algorithm based on the dataset samples, so as to construct an initial determination model; and in the back-propagation fine-tuning phase, the constructed initial determination model is fine-tuned based on the labeled electrical data to obtain the determination model for determining whether the power electronic system has an instability fault.

Specifically, the process of optimizing the classification network using the reinforcement learning algorithm is as follows:

step 2-1, randomly initializing an underlying network layer to obtain initial training model accuracy;

step 2-2, using a fine-tuned determination model at a current moment as a framework, and selecting an alternative network layer as a hidden layer of the network layers in the framework using a greedy algorithm to generate a determination model at a next moment;

step 2-3, comparing a predicted loss rate of the fine-tuned determination model at the current moment with a predicted loss rate of the determination model at the next moment generated in step 2-2, and placing a comparison result as a reward value and a corresponding determination model into an experience playback buffer;

step 2-4, repeating step 2-2 to step 2-3 until the total number of reward values in the experience playback buffer reaches a threshold;

step 2-5, acquiring electrical data and corresponding prediction results from the experience playback buffer as test samples, and calculating a target return value for each determination model based on the test samples; and step 2-6, calculating corresponding losses based on the target return values, and updating parameters in the action space in a gradient descent method based on the calculated losses to output a determination model satisfying requirements.

Specifically, the expression of the reward value is as follows:

$$R_t = \begin{cases} 1 & \text{if accuracy:} DBN_{t+1} \geq DBN_t \\ -1 & \text{if accuracy:} DBN_{t+1} < DBN_t \end{cases}$$

where $DBN_{t+1}$ denotes the determination model at the next moment, and $DBN_t$ denotes the fine-tuned determination model at the current moment.

Specifically, the expression of the target return value is as follows:

$$y_i = R_i + \gamma \max_{a'} Q(S'_{i+1}, a'_i; \theta'),\ i = 1, \ldots, N$$

where $y_i$ denotes a target return value in each state $S_i$, $R_i$ denotes a reward correspondingly obtained by taking an action $a'_i$ in the state $S_i$ through critic prediction, $S'_{i+1}$ denotes a state obtained after taking the action $a'_i$ in the state $S_i$ through critic prediction, $\theta'$ denotes a parameter of critic, and $\max_{a't} Q(S'_{i+1}, a'_i; \theta')$ denotes a maximum value in the corresponding state $S_i$ obtained through critic prediction.

Specifically, the expression of calculating corresponding losses based on the target return values is as follows:

$$L(\theta) = \frac{1}{N} \sum_{i=1}^{N} (y_i - Q(S_{i+1}, a_i; \theta))^2$$

where $\theta$ denotes a to-be-updated parameter of actor, $S_{i+1}$ denotes a state obtained after taking an actual action $a_i$ in a state $S_i$ in N samples actually collected in the buffer, and $Q(S_{i+1}, a_i; \theta)$ denotes an actual value in the state $S_i$ in the N samples actually collected in the buffer.

In order to realize the second purpose of the present invention, the following technical solution is provided: an instability fault monitoring apparatus includes a memory and a processor, the memory has a computer program stored therein, and the processor, when executing the computer program, implements the instability fault monitoring method with self-learning strong generalization capability described above.

The specific implementation process is: a trained model may be deployed to a controller of an actual system, and after the occurrence of instability, electrical features collected by each module are input into the control program to determine the type of the instability fault, so that fault diagnosis and localization of an instability source are carried out.

Compared with the prior art, the present invention has the following beneficial effects:

the core of the model constructed through the present invention is the excellent generalization capability thereof and low requirement for labeled data, so that the model can adapt to and accurately diagnose instability phenomena in various power electronic systems and specific faults of individual modules;

through advanced self-learning algorithms, the method not only can automatically generate high-precision diagnostic models, but also can continuously adapt to the evolution of the systems and different failure modes; and by utilizing advanced data processing and machine learning techniques, the operational status of the systems can be monitored in real time, and thus potential instability risks can be found in time. The combination of the capability of real-time monitoring and the automatically generated high-precision diagnostic models provides a solid guarantee for the stable operation of the power systems, as well as detailed and accurate guidance for subsequent maintenance and troubleshooting.

DESCRIPTION OF THE EMBODIMENTS

Figure 1:
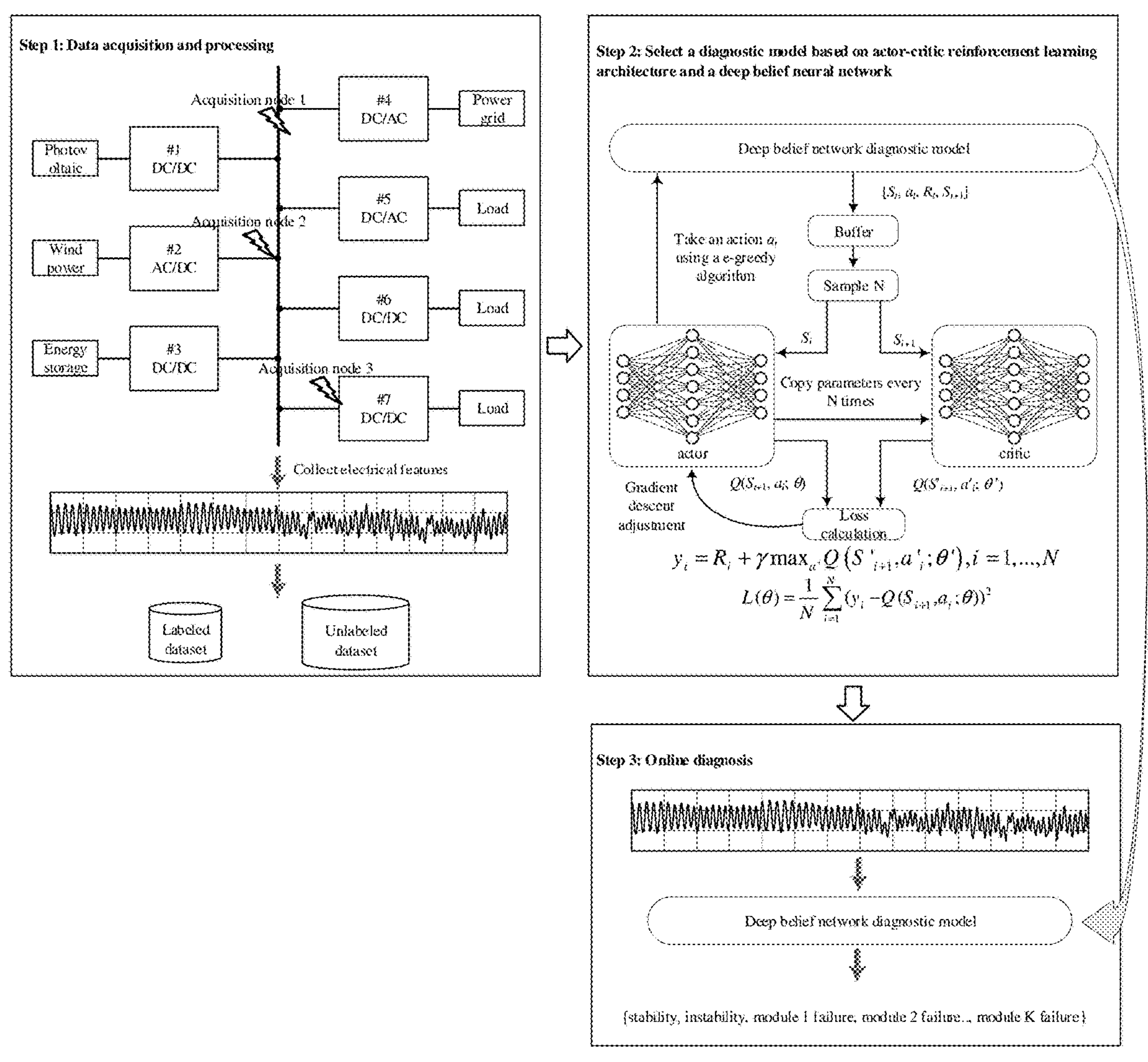
FIG. 1 is a flowchart of an instability fault monitoring method with self learning strong generalization capability according to the present invention.

Exemplary implementations of the present invention are now described with reference to the accompanying drawings, however, the present invention may be implemented in many different forms and is not limited to the embodiments described herein, which are provided for the purpose of disclosing the present invention in an exhaustive and complete manner and of communicating the scope of the present invention adequately to those skilled in the art to which it belongs. Terms used for the exemplary implementations represented in the accompanying drawings are not a limitation of the present invention. In the accompanying drawings, the same units/components use the same reference numerals.

Unless otherwise indicated, terms (including scientific and technical terms) used herein have the commonly understood meaning to those skilled in the art to which they belong. Further, it is to be understood that terms qualified by commonly used dictionaries should be understood to have a meaning consistent with the context of their related fields and should not be understood in an idealized or overly formal sense.

FIG. 1 shows a flowchart of instability fault monitoring according to the present embodiment, which is divided into three steps:

step 1, collect electrical data of each electronic device in a power electronic system, select some of the electrical data to be labeled with types of system instability faults, and combine the labeled electrical data with unlabeled electrical data to form dataset samples;

step 2, construct a classification network based on a deep belief neural network framework, the classification network including a plurality of superimposed and connected network layers and a softmax layer connected to an end network layer, train the classification network using the dataset samples to construct a determination model for determining whether the power electronic system has an instability fault, and optimize the training process of the classification network using a reinforcement learning algorithm, a reinforcement learning network taking the network layers of different structures as action space, and taking a loss rate of the determination model of previous and latter trainings as an optimization objective to obtain an optimization result, and the optimization result including a superimposed network structure and a corresponding predicted loss rate; and step 3, input the electrical data in the power electronic system into a determination model satisfying a predetermined predicted loss rate in step 2, so as to output a determination result indicating whether the power electronic system has an instability fault.

Furthermore, the specific process of step S1 includes:

step 1-1, take a bus of the power electronic system as a backbone, and connect power converters in the system to the backbone as module branches, so as to construct an equivalent model of the power electronic system;

step 1-2, collect electrical data from each module branch and the backbone according to a predetermined type of instability faults;

step 1-3, determine the corresponding instability fault category K to be identified, the fault problems to be solved including {stability, instability, module 1 failure, module 2 failure, . . . , module K failure}; and step 1-4, extract, by a corresponding acquisition node, data to form samples, the data including only a small amount of labeled data and a large amount of unlabeled data.

Figure 2:
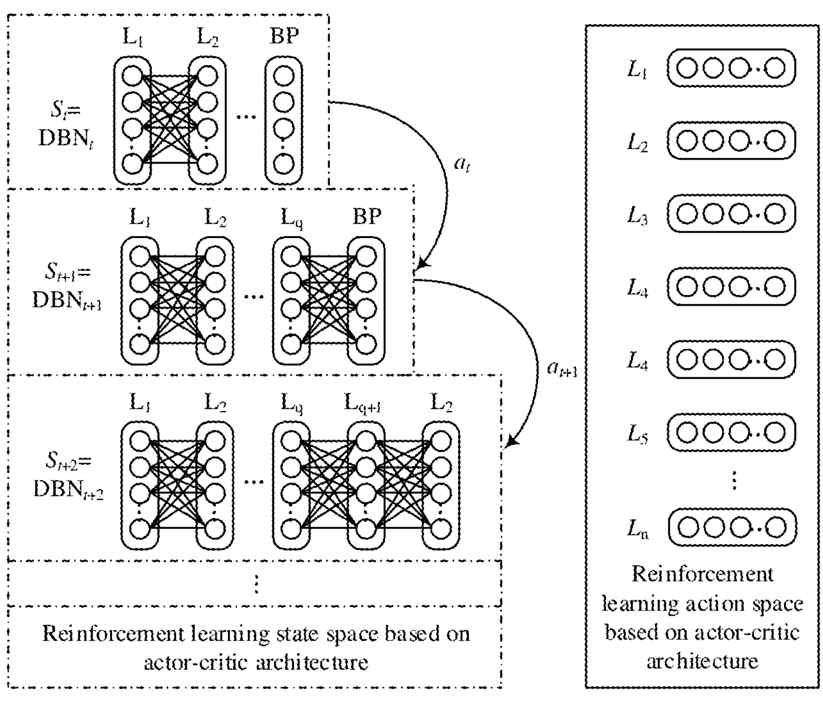
FIG. 2 is a composition diagram of actor-critic reinforcement learning architecture according to the present invention.

FIG. 2 is a framework diagram of the reinforcement learning algorithm adopted in step 2. The reinforcement learning algorithm is an actor-critic reinforcement learning model. Actor and critic are both multilayer perceptron structures, and the diagnostic model to be constructed is a deep belief neural network including a plurality of superimposed and connected network layers and a softmax layer connected to an end network layer. The network layers are selected from the action space, and the output classification of the softmax layer connected to the end network layer is determined by the category K of a targeted diagnostic task.

Figure 3:
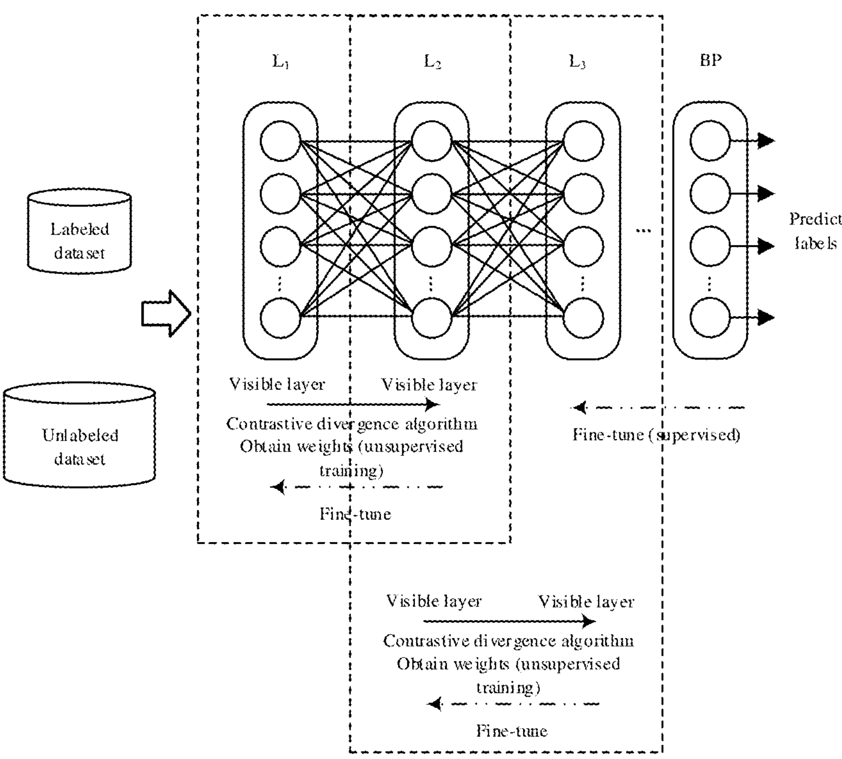
FIG. 3 is a schematic diagram of training of a deep belief neural network according to the present invention.

The determination model is a deep belief network, which can effectively solve the problem about instability diagnosis in the case of label scarcity. FIG. 3 is a schematic diagram of training of the deep belief neural network. The training process includes an unsupervised pre-training phase and a supervised back-propagation fine-tuning phase.

In the pre-training phase, each of the network layers is trained using a contrastive divergence algorithm based on the dataset samples, so as to construct an initial determination model.

In the back-propagation fine-tuning phase, the constructed initial determination model is fine-tuned based on the labeled electrical data to obtain the determination model for determining whether the power electronic system has an instability fault.

Figure 4:
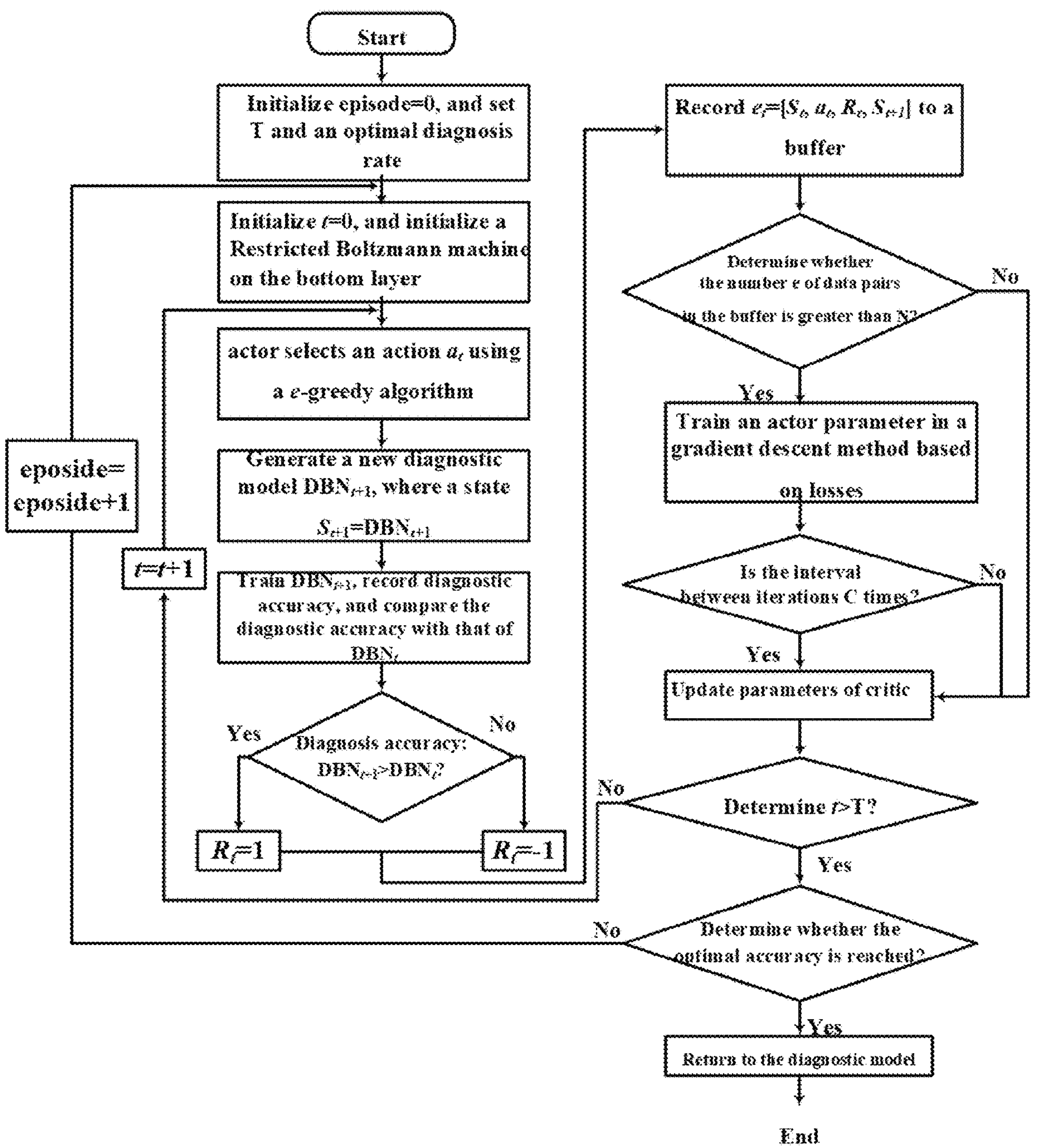
FIG. 4 shows a specific flow of training based on actor-critic reinforcement learning architecture and a deep belief neural network according to the present invention.

The specific flow of optimizing the classification network using the reinforcement learning algorithm is shown in FIG. 4, including:

parameters are initialized, episode=0, T is set as the maximum number of execution steps in each episode, and the optimal diagnosis rate is set.

Then, the following operations are performed in each episode for a total of T steps:

(1) The iteration moment t=0 is initialized, and an underlying network layer structure is randomly initialized.

(2) Then, actor selects an action $a_t$ at the current moment using the ε-greedy algorithm, the variation of the parameter ε being obtained using the following equation:

$$\varepsilon = \begin{cases} \varepsilon \times \varepsilon_{\Delta}, & \text{if } \varepsilon \geq \varepsilon_{min} \\ \varepsilon_{min}, & \text{others} \end{cases}$$

where $\varepsilon_{min}$ denotes the minimum value of ε, and $\varepsilon_{\Delta}$ is an attenuation factor. The initial ε is set as 1, $\varepsilon_{min}$ is 0.1, and $\varepsilon_{\Delta}$ is 0.998.

The input of actor is a state $S_t=DBN_t$ at the current moment t. Based on the state $S_t$ and following the strategy we, actor takes an action $a_t$, a network layer is selected from alternative models to form the determination model at the moment t, and then a diagnostic model $S_{t+1}=DBN_{t+1}$ is formed together with the corresponding softmax layer. It is worth mentioning that the parameter migration technique is adopted, the new diagnostic model does not need to be retrained in the training process, and training is performed after the parameters of $S_t$ are directly migrated, which greatly reduces the amount of computation.

(3) The optimal diagnostic accuracy is obtained by comparing the diagnostic accuracy of $DBN_{t+1}$ with the diagnostic accuracy of $DBN_t$, and at the same time, actor obtains a reward $R_t$ according to the following equation:

$$R_t = \begin{cases} 1 & \text{if accuracy:} DBN_{t+1} \geq DBN_t \\ -1 & \text{if accuracy:} DBN_{t+1} < DBN_t \end{cases}$$

The obtained $e_t=[S_t, a_t, R_t, S_{t+1}]$ is recorded to the buffer.

(4) When the number of data pairs $[S_t, a_t, R_t, S_{t+1}]$ stored in the buffer reaches a certain set value N (if the number does not reach N, steps (2)-(3) are repeated), training update is performed on the actor parameter. N small batch samples are mainly sampled from the buffer, and critic is utilized to predict the corresponding action $a'_i$ that may be taken in the state $S_i$ (i=1, 2, . . . , N), as well as the obtained reward $R_i$, and a target return value in the state $S_i$ is calculated.

$$y_i = R_i + \gamma \max_{a'} Q(S'_{i+1}, a'_i; \theta'),\ i = 1, \ \ldots\ , N$$

where $y_i$ denotes a target return value in each state $S_i$, $R_i$ denotes a reward correspondingly obtained by taking an action $a'_i$ in the state $S_i$ through critic prediction, $S'_{i+1}$ denotes a state obtained after taking the action $a'_i$ in the state $S_i$ through critic prediction, θ' denotes a parameter of critic, and $\max_{a'i} Q(S'_{i+1}, a'_i; \theta')$ denotes a maximum value in the corresponding state $S_i$ obtained through critic prediction.

A loss function is finally obtained:

$$L(\theta) = \frac{1}{N} \sum_{i=1}^{N} (y_i - Q(S_{i+1}, a_i; \theta))^2$$

where θ denotes a to-be-updated parameter of actor, $S_{i+1}$ denotes a state obtained after taking an actual action $a_i$ in a state $S_i$ in N samples actually collected in the buffer, and $Q(S_{i+1}, a_i, \theta)$ denotes an actual value in the state $S_i$ in the N samples actually collected in the buffer.

After the loss is obtained, the actor parameter θ is updated in a gradient descent method.

(5) A weight value of critic is updated every C times to be consistent with a weight value of actor, i.e., θ'=θ.

When the execution exceeds T times, whether the recorded optimal accuracy value meets the requirement is determined. If the value meets the requirement, the training is terminated. Otherwise, the next episode is started, and the neural network of the actor-critic architecture outputs a corresponding diagnostic model.

The present embodiment further provides an instability fault monitoring apparatus. The instability fault monitoring apparatus includes a memory and a processor, the memory has a computer program stored therein, and the processor, when executing the computer program, implements the instability fault monitoring method with self-learning strong generalization capability provided in the above embodiment.

The present invention can automatically generate high-precision diagnostic models for different power electronic system structures and different fault diagnostic tasks, and can continuously adapt to the evolution of the systems and different fault modes. The requirements for data samples are not high, that is, the present invention has practical application values. In addition, by means of advanced data processing and machine learning techniques, the apparatus of the present invention can monitor the operational status of the systems in real time to find potential instability risks in time. The combination of the capability of real-time monitoring and the automatically generated high-precision diagnostic models provides a solid guarantee for the stable operation of the power systems, as well as detailed and accurate guidance for subsequent maintenance and troubleshooting.

Figure 5:
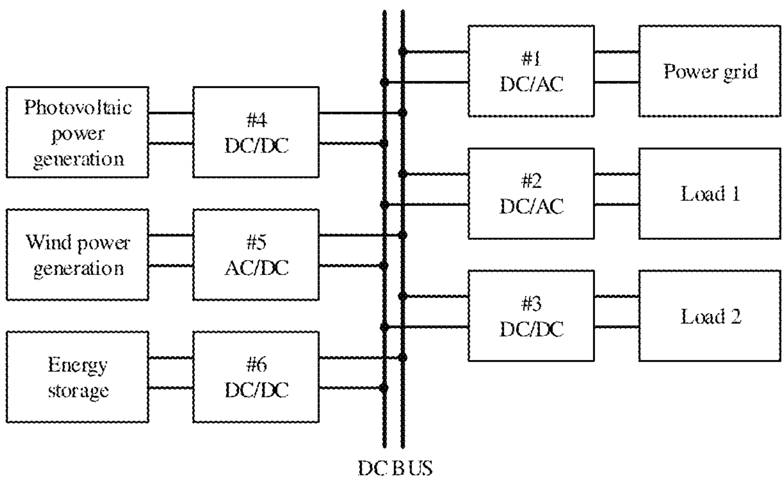
FIG. 5 is a case of a research object exemplified by the present invention.

In order to better illustrate the technical effects of the method provided by the present invention, a power electronization power system as shown in FIG. 5 is taken as an example, and an instability fault monitoring and determining network is automatically generated therefor.

In the figure, a DC bus in the system is taken as the backbone, and a photovoltaic power generation module, a wind power generation module, an energy storage module, a power grid, an AC load 1 and a DC load 2 are disposed on two sides of the backbone, each of which is connected to the DC bus through a corresponding power converter.

First, inputs are prepared:

DC bus voltage data in the system is collected, some of the electrical data are selected to be labeled with the types of system instability faults, and the labeled electrical data X_label are combined with unlabeled electrical data X_unlabel to form dataset samples X;

a to-be-determined type K=8 is set, including: {system stability, system instability, module #1 failure, module #2 failure, module #3 failure, module #4 failure, module #5 failure, module #6 failure}; and then X and the set value K are input into the described instability fault monitoring apparatus for self-learning type strong generalization learning to obtain a generated classification determination model. The specific steps are as follows:

(1) First, the iteration moment t=0 is initialized, and an underlying network layer of the classification determination model is randomly initialized.

(2) Then, the actor structure in reinforcement learning selects an action $a_t$ at the current moment using the s-greedy algorithm. The input of actor is a state $S_i$=DBN$_t$ at the current moment t. Based on the state $S_t$ and following the strategy $\pi_\theta$, actor takes the action $a_t$, and a network layer is selected from the action space of reinforcement learning, and forms a new classification determination model $S_{t+1}$=DBN$_{t+1}$ together with the fixed softmax layer formed by eight nerve cells.

(3) The optimal diagnostic accuracy is obtained by comparing the diagnostic accuracy of DBN$_{t+1}$ with the diagnostic accuracy of DBN$_t$, and at the same time, actor obtains a reward $R_t$ and records the obtained $e_t[S_t, a_t, R_t, S_{t+1}]$ to a buffer.

(4) When the number of data pairs $[S_t, a_t, R_t, S_{t+1}]$ stored in the buffer reaches a certain set value of 20 (if the number does not reach 20, steps (2)-(3) are repeated), training update is performed on the actor parameter at each moment. N small batch samples are mainly sampled from the buffer, and critic is utilized to predict the corresponding action $a'_i$ that may be taken in the state $S_i$ (i=1, 2, . . . , 20), as well as the obtained reward $R_i$, and a target return value in the state $S_i$ is calculated.

$$y_i = R_i + \gamma \max_{a'} Q(S'_{i+1}, a'_i; \theta'), \; i = 1, \; \dots \;, N$$

where $y_i$ denotes a target return value in each state $S_i$, $R_i$ denotes a reward correspondingly obtained by taking an action $a'_i$ in the state $S_i$ through critic prediction, $S'_{i+1}$ denotes a state obtained after taking the action $a'_i$ in the state $S_i$ through critic prediction, θ' denotes a parameter of critic, and $\max_{a'i} Q(S'_{i+1}, a'_i; \theta')$ denotes a maximum value in the corresponding state $S_i$ obtained through critic prediction.

A loss function is finally obtained:

$$L(\theta) = \frac{1}{N}\sum_{i=1}^{N}(y_i - Q(S_{i+1}, a_i; \theta))^2$$

where θ denotes a to-be-updated parameter of actor, $S_{i+1}$ denotes a state obtained after taking an actual action $a_i$ in a state $S_i$ in N samples actually collected in the buffer, and $Q(S_{i+1}, a_i; \theta)$ denotes an actual value in the state $S_i$ in the N samples actually collected in the buffer.

After the loss is obtained, the actor parameter θ is updated in a gradient descent method.

(5) A weight value of critic is updated every 5 times to be consistent with a weight value of actor, i.e., θ'=θ.

Finally, when the recorded optimal accuracy value meets the requirement, the training is terminated, and the neural network of the actor-critic architecture outputs a corresponding diagnostic model.

Finally, the instability monitoring network that can be fully applied to the power electronic system shown in the figure is automatically generated, and the instability monitoring network can automatically output the type of instability faults identified.

What is claimed is:

1. A computer-implemented instability fault monitoring method with self-learning strong generalization capability, characterized by comprising the following steps:

step 1, collecting electrical data of each electronic device in a power electronic system, selecting some of the electrical data to be labeled with types of system instability faults, and combining the labeled electrical data with unlabeled electrical data to form dataset samples, wherein the specific process of collecting the electrical data is as follows:

taking a bus of the power electronic system as a backbone, and regarding power converters in the power electronic system as module branches to be connected to the backbone, so as to construct an equivalent model of the power electronic system; and collecting electrical data from each module branch and the backbone according to a predetermined type of instability faults, which is, determining the corresponding instability fault category K to be identified, the fault problems to be solved being {stability, instability, module 1 failure, module 2 failure, . . . , module K failure};

step 2, constructing a classification network based on a deep belief neural network framework, the classification network comprising a plurality of superimposed and connected network layers and a softmax layer connected to an end network layer, the output classification of the softmax layer connected to the end network layer being determined by a diagnostic task category K targeted, training the classification network using the dataset samples to construct a determination model for determining whether the power electronic system has an instability fault, wherein the training process comprises an unsupervised pre-training phase and a supervised back-propagation fine-tuning phase;

in the pre-training phase, each of the network layers is trained using a contrastive divergence algorithm based on the dataset samples, so as to construct an initial determination model; and in the back-propagation fine-tuning phase, the constructed initial determination model is fine-tuned based on the labeled electrical data to obtain the determination model for determining whether the power electronic system has an instability fault; and optimizing the training process of the classification network using a reinforcement learning algorithm, wherein a reinforcement learning network takes a network structure composed of different numbers of network layers and a softmax layer as action space, and takes a loss rate of the determination model of previous and latter trainings as an optimization objective to obtain an optimization result, wherein the optimization result comprises a superimposed network structure and a corresponding predicted loss rate; wherein optimizing the training process comprises:

parameters are initialized, episode=0, T is set as the maximum number of execution steps in each episode, and the optimal diagnosis rate is set; then, the following operations are performed in each episode for a total of T steps:

(1) the iteration moment t=0 is initialized, and an underlying network layer structure is randomly initialized;

(2) then, an actor selects an action $a_t$ at the current moment using a ε-greedy algorithm;

the input of the actor is a state $S_t$=DBN$_t$ at the current moment t based on the state $S_t$ and following the strategy $\pi_\theta$, the actor takes an action $a_t$, a network layer is selected from alternative models to form the determination model at the moment t, and then a diagnostic model $S_{t+1}$=DBN$_{t+1}$ is formed together with the corresponding softmax layer;

(3) the optimal diagnostic accuracy is obtained by comparing the diagnostic accuracy of DBN$_{t+1}$ with the diagnostic accuracy of DBN$_t$, and at the same time, the actor obtains a reward $R_t$;

(4) when the number of data pairs $[S_t, a_t, R_t, S_{t+1}]$ stored in the buffer reaches a certain set value N (if the number does not reach N, steps (2)-(3) are repeated), training update is performed on an actor parameter, N small batch samples are mainly sampled from the buffer, and a critic is utilized to predict the corresponding action $a'_i$ that may be taken in the state $S_i$ (i=1, 2, . . . , N), as well as the obtained reward $R_i$, and a target return value in the state $S_i$ is calculated;

a loss function is finally obtained:

$$L(\theta) = \frac{1}{N}\sum_{i=1}^{N}(y_i - Q(S_{i+1}, a_i; \theta))^2$$

where θ denotes a to-be-updated parameter of the actor, $S_{i+1}$ denotes a state obtained after taking an actual action $a_i$ in a state $S_i$ in N samples actually collected in the buffer, and $Q(S_{i+1}, a_i; \theta)$ denotes an actual value in the state $S_i$ in the N samples actually collected in the buffer;

after the loss is obtained, the actor parameter θ is updated in a gradient descent method;

(5) a weight value of the critic is updated every C times to be consistent with a weight value of the actor, i.e., θ'=θ, when the execution exceeds T times, whether the recorded optimal accuracy value meets the requirement is determined; if the value meets the requirement, the training is terminated; otherwise, the next episode is started, and the neural network of the actor-critic architecture outputs a corresponding diagnostic model;

step 3, inputting the electrical data in the power electronic system into a determination model satisfying a predetermined predicted loss rate in step 2, so as to output a determination result indicating whether the power electronic system has an instability fault, wherein the determination result comprises determining the type of instability fault, and fault diagnosis and localization of the instability source fault.

2. The computer-implemented instability fault monitoring method with self-learning strong generalization capability according to claim 1, characterized in that the reinforcement learning algorithm is an actor-critic reinforcement learning model.

3. The computer-implemented instability fault monitoring method with self-learning strong generalization capability according to claim 1, characterized in that the expression of the reward value is as follows:

$$R_t = \begin{cases} 1 & \text{if accuracy:}DBN_{t+1} \geq DBN_t \\ -1 & \text{if accuracy:}DBN_{t+1} < DBN_t \end{cases}$$

wherein $DBN_{t+1}$ denotes the determination model at the next moment, and $DBN_t$ denotes the fine-tuned determination model at the current moment.

4. The computer-implemented instability fault monitoring method with self-learning strong generalization capability according to claim 3, characterized in that the expression of the target return value is as follows:

$$y_i = R_i + \gamma \max_{a'} Q(S'_{i+1}, a'_i; \theta'),\ i = 1, \ldots, N$$

wherein $y_i$ denotes a target return value in each state $S_i$, $R_i$ denotes a reward correspondingly obtained by taking an action $a'_i$ in the state $S_i$ through a critic prediction, $S'_{i+1}$ denotes a state obtained after taking the action $a'_i$ in the state $S_i$ through the critic prediction, θ' denotes a parameter of the critic, and $\max_{a'_i} Q(S'_{i+1}, a'_i; \theta')$ denotes a maximum value in the corresponding state $S_i$ obtained through the critic prediction.

5. An instability fault monitoring apparatus, comprising a non-transitory memory and a processor, and the memory having a computer program stored therein, characterized in that the processor, when executing the computer program, implements the instability fault monitoring method with self-learning strong generalization capability according to claim 1.

* * * * *